（12） United States Patent
Kawashima et al.

(10) Patent No.: US 7,012,829 B2
(45) Date of Patent: Mar. 14, 2006

(54) FERROELECTRIC MEMORY AND DATA READING METHOD FOR SAME

(75) Inventors: Shoichiro Kawashima, Kawasaki (JP); Toru Endo, Kawasaki (JP); Tomohisa Hirayama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/050,781

(22) Filed: Feb. 7, 2005

(65) Prior Publication Data

US 2005/0128784 A1 Jun. 16, 2005

Related U.S. Application Data

(63) Continuation of application No. PCT/JP03/04559, filed on Apr. 10, 2003.

(51) Int. Cl.
*G11C 11/22* (2006.01)

(52) U.S. Cl. .................................. 365/145; 365/189.09

(58) Field of Classification Search ................ 365/145, 365/189.09, 149

See application file for complete search history.

(56) References Cited

U.S. PATENT DOCUMENTS

| 6,487,103 | B1 | 11/2002 | Yamamoto et al. |
| 6,646,909 | B1 * | 11/2003 | Miwa et al. ................. 365/154 |
| 6,687,151 | B1 * | 2/2004 | Endo et al. .................. 365/145 |
| 6,809,953 | B1 * | 10/2004 | Toyoda et al. ............... 365/145 |
| 2003/0053326 | A1 | 3/2003 | Murakuki |

FOREIGN PATENT DOCUMENTS

| JP | 2002-133857 | 5/2002 |
| JP | 2003-77271 | 3/2003 |

* cited by examiner

*Primary Examiner*—Anh Phung
(74) *Attorney, Agent, or Firm*—Arent Fox, PLLC.

(57) ABSTRACT

A bit line is connected, via a first pMOS transistor, to a first node whose potential is set at a prescribed negative voltage in advance. The gate voltage of the first pMOS transistor is set at a constant voltage that is slightly lower than its threshold voltage. During a read operation, a current that flows into the bit line from a memory cell in accordance with a residual dielectric polarization value of a ferroelectric capacitor always leaks to the first node, whereby the potential of the first node increases. The logical value of data stored in the memory cell is judged on the basis of a voltage increase at the first node. Since no control circuit for keeping the potential of the first node at the ground potential during a read operation is necessary, the layout size and the power consumption of a ferroelectric memory can be decreased.

9 Claims, 9 Drawing Sheets

FERROELECTRIC MEMORY AND DATA READING METHOD FOR SAME

CROSS-REFERENCE TO RELATED APPLICATION

This application is a continuation application of International Application No. PCT/JP03/04559, filed Apr. 10, 2003, and designating the U.S.

BACKGROUND OF THE INVENTION

1. Field of the Invention

The present invention relates to a ferroelectric memory and, more particularly, to a data read circuit for reading out data that were written to ferroelectric capacitors.

2. Description of the Related Art

Recently, a ferroelectric memory reading method called "bitline GND sensing method" has been proposed (IEEE Journal of Solid-State Circuits, Vol. 37, No. 5, pp. 592–597, May 2002 and Japanese Unexamined Patent Application Publication No. 2002-133857).

FIG. 1 shows the main part of a ferroelectric memory that employs the conventional bit-line GND sensing method. A memory cell array ARY has memory cells MC called "2T2C cells" and column switches CSW. To hold 1-bit information, each 2T2C cell is composed of two transfer transistors and two ferroelectric capacitors FC. One end of each ferroelectric capacitor FC is connected to a bit line BL or XBL via the associated transfer transistor and the other end is connected to a plate line PL. The gate of each transfer transistor is connected to a word line WL. Symbol Cbl denotes the capacitance of each bit line. The column switches CSW connect the bit lines BL and XBL to data bus lines in response to a column-selecting signal that is activated by an address signal. The data bus lines are discharged to the ground potential by a bus-grounding signal BUSG, and are connected to respective bit-line GND sensing circuits BGS by a bus-on signal BUSON.

Each bit-line GND sensing circuit BGS has an inverter amplifier IAMP, a charge-transfer CT, an isolation gate ISO, a threshold voltage generator VTG, a negative voltage generator NEGG, a negative voltage control circuit NEGC, and a coupling capacitor Ctrans for converting a negative voltage to a positive voltage.

Activated by a high level of a short signal SHORT during a read operation, the inverter amplifier IAMP lowers the voltage of the control node VT of the charge-transfer CT (pMOS transistor) when the voltage of the bit line BL or XBL increases.

The threshold voltage generator VTG has a capacitor Cgate that receives the inverted logic of a control signal VTGEN and a clamping circuit that is connected to a node GT. The potential of the node GT is set at –0.7 to 0.7 V by the clamping circuit. The threshold voltage generator VTG generates a negative voltage (–0.7 V) at the node GT in response to a variation of the control signal VTGEN to a high level. This negative voltage is equal to the threshold voltage of the charge-transfer CT.

The negative voltage generator NEGG has a capacitor Ctank that receives the inverted logic of a control signal NEGGEN and a pMOS transistor for initializing a negative-voltage node VNEG to the ground potential. The negative voltage generator NEGG generates a negative voltage at the node VNEG in response to a variation of the control signal NEGGEN to a high level.

The negative voltage control circuit NEGC has capacitors that receive the inverted logic of respective control signals CLP2GEN and CLP1GEN, a pMOS transistor for initializing a node CLP2 to the ground potential, and a clamping circuit that is connected to a node CLP1. The potential of the node CLP1 is set at a value in a range of –2.1 to 0.7 V by the clamping circuit. The node CLP2 is initialized reliably to the ground potential when the potential of the node CLP1 is set at –2.1 V. The negative voltage control circuit NEGC supplies a negative voltage to the control gate of the isolation gate ISO (pMOS transistor) in response to a variation of the control signal CLP2GEN to a high level. As a result, a negative voltage (–0.7 V) of the node GT is transmitted reliably to the node VT when the isolation gate ISO is turned on.

The above-described conventional bit-line GND sensing circuit BGS operates in the following manner and thereby performs a read operation.

First, the control signal CLP1GEN varies to the high level two times, whereby the node CLP2 is initialized to the ground potential. The bit lines BL and XBL are connected to the bit-line GND sensing circuits BGS because the bus-on signal BUSON varies to the high level. The inverter amplifier IAMP is activated because the short signal SHORT varies to the high level.

Then, the potential of the node CLP2 is changed to a negative voltage because the control signal CLP2GEN varies to the high level, whereupon the isolation gate ISO is turned on. The potentials of the nodes GT and VT are changed to –0.7 V because the control signal VTGEN varies to the high level.

The ferroelectric capacitors FC are connected to the respective bit lines BL and XBL because the potential of the word line WL varies to the high level. The bit lines BL and XBL are connected to the respective data bus lines because the column-selecting signal CL varies to the high level. The precharging period of the bit lines BL and XBL and the data bus lines is finished when the bus-grounding signal varies to the low level.

Subsequently, the control signal NEGGEN varies to the high level, whereby the potential of the node VNEG is changed to a negative voltage. Then, the potential of the plate line PL varies to the high level, whereupon the potentials of the bit lines BL and XBL increase in accordance with the residual dielectric polarization values of the ferroelectric capacitors FC, respectively, and, in turn, the potential of the node VT decreases because of the feedback action of the inverter amplifier IAMP. As a result, the charge on each of the bit lines BL and XBL is absorbed by the capacitor Ctank of the negative voltage generator NEGG. That is, the potentials of the bit lines BL and XBL return to the ground potential.

The residual dielectric polarization value of each ferroelectric capacitor FC appears as a voltage variation at the node VNEG that is connected to the capacitor Ctank. The (negative) voltage of the node VNEG is converted to a positive voltage by the coupling capacitor Ctrans. A sense amplifier SA differentially amplifies voltages that are output from the bit-line GND sensing circuits BGS corresponding to the respective bit lines BL and XBL That is, the data that is held by the memory cell MC is read out to the outside.

To keep the potentials of the bit lines BL and XBL during a read operation, the above-described bit-line GND sensing circuits BGS each require the inverter amplifier IAMP, which is a factor of increasing the circuit area. The inverter amplifier IAMP has an operation current of about 100 $\mu$A.

Ferroelectric memories using 2T2C cells require two bit-line GND sensing circuits for each I/O bit. For example, a ferroelectric memory having a 16-bit data terminal requires 32 bit-line GND sensing circuits BGS. Therefore, the circuit area and the current consumption of each inverter amplifier IAMP have great influences on the chip size and the power consumption, respectively, of a ferroelectric memory.

Further, to enable correct operation of the inverter amplifier IAMP, the isolation gate ISO for isolating the nodes VT and GT from each other is necessary. To transmit a negative voltage generated at the node GT to the node VT via the isolation gate ISO, it is necessary to apply a deep negative voltage to the isolation gate ISO. This requires the complex negative voltage control circuit NEGC. To cause the complex negative voltage control circuit NEGC to operate at the initial stage of a read operation, the node VT potential setting period (precharging period) needs to be sufficiently long (about 30 ns). And the long precharging period is an obstruction to shortening of the read access time.

SUMMARY OF THE INVENTION

One object of the present invention is to decrease the layout size of a ferroelectric memory.

Another object of the invention is to reduce the power consumption of a ferroelectric memory.

A further object of the invention is to shorten the access time of a ferroelectric memory.

According to one aspect of the invention, a first pMOS transistor connects, to a first node, a bit line that is connected to a memory cell having a ferroelectric capacitor. The potential of the first node is initially set at a prescribed negative voltage in advance by a negative voltage generator. The gate voltage (second node) of the first pMOS transistor is set at a constant voltage that is slightly lower than its threshold voltage by a threshold voltage generator. As a result, the first pMOS transistor is kept on so as to allow a flow of slight current while data is read from the memory cell. A current that flows into the bit line from the memory cell in accordance with a residual dielectric polarization value of the ferroelectric capacitor leaks to the first node. The logical value of the data stored in the memory cell on the basis of a voltage increase at the first node.

Since the gate voltage of the first pMOS transistor is set at a value that is slightly smaller than its own threshold voltage, a current always leaks from the bit line to the first node to increase the potential of the first node during a read operation. Therefore, for example, a control circuit (a feedback circuit such as an inverter amplifier) for keeping the potential of the bit line at the ground potential during a read operation is not necessary. This makes it possible to decrease the layout size of the ferroelectric memory. Since no such control circuit is necessary, the power consumption of the ferroelectric memory can be reduced.

According to another aspect of the invention, a second pMOS transistor is turned on by a voltage of a second node and connects the first node to a ground line. Charge is extracted from the second node by a second coupling capacitor before reading of the data from the memory cell, whereby the potential of the second node is temporarily set at a deep negative voltage. Charge is supplied to the second node by a clamping circuit for setting the potential of the second node at a constant voltage, in a period when the potential of the second node is set at the deep negative voltage. The second pMOS transistor is turned on to initialize the first node to the ground potential, in an undershoot period when the potential of the second node varies from the deep negative voltage to the constant voltage. Then, charge is extracted from the first node by a first coupling capacitor to set the potential of the first node at the prescribed negative voltage. Since the potential of the first node can be initialized to the ground potential merely by turning on the second pMOS transistor utilizing the fact that the potential of the second node becomes a deep negative voltage temporarily, the first node can be initialized at high speed. Therefore, the initialization period (precharging period) before a read operation can be shortened and hence the read access time can be shortened. Since the potential of the first node can be initialized by utilizing the circuit for keeping the second node at the constant voltage, circuits necessary for the initialization before a read operation can be simplified in configuration. As a result, the size of the ferroelectric memory can be decreased.

According to another aspect of the invention, the clamping circuit comprises a third pMOS transistor whose source, drain, and gate are connected to the second node, the ground line, and the second node, respectively. The threshold voltage of the third pMOS transistor is lower than that of the first pMOS transistor. Therefore, the clamping circuit can easily generate the constant voltage that is lower than the threshold voltage of the first pMOS transistor. The threshold voltages of the first and third pMOS transistors can be set easily with high accuracy by making their ratios W/L of the gate width W to the channel length L different from each other.

According to still another aspect of the invention, the threshold voltage of the second pMOS transistor is lower than that of the third pMOS transistor. This makes it possible to prevent a phenomenon that charge is supplied from the ground line to the first node via the third pMOS transistor after the potential of the second node has varied from the deep negative voltage to the constant negative voltage that corresponds to the threshold voltage of the third MOS transistor. This in turn makes it possible to set the potential of the first node at the prescribed negative voltage reliably. The threshold voltages of the second and third pMOS transistors can be set easily with high accuracy by making their ratios W/L of the gate width W to a channel length L different from each other.

According to a further aspect of the invention, a third coupling capacitor that is provided between the first node and a third node generates a positive voltage at the third node in accordance with a negative voltage of the first node. The input terminal of a source follower circuit is connected to the third node. To set the potential of the third node at a prescribed positive voltage in advance, a dividing capacitor is connected to the third coupling capacitor via the third node. With this measure, the negative voltage of the first node that goes up following the current flowing into the bit line from the memory cell can easily be converted to a positive voltage that allows the source follower circuit to operate normally by the capacitance-type voltage division using the third coupling capacitor and the dividing capacitor.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Figure 1:
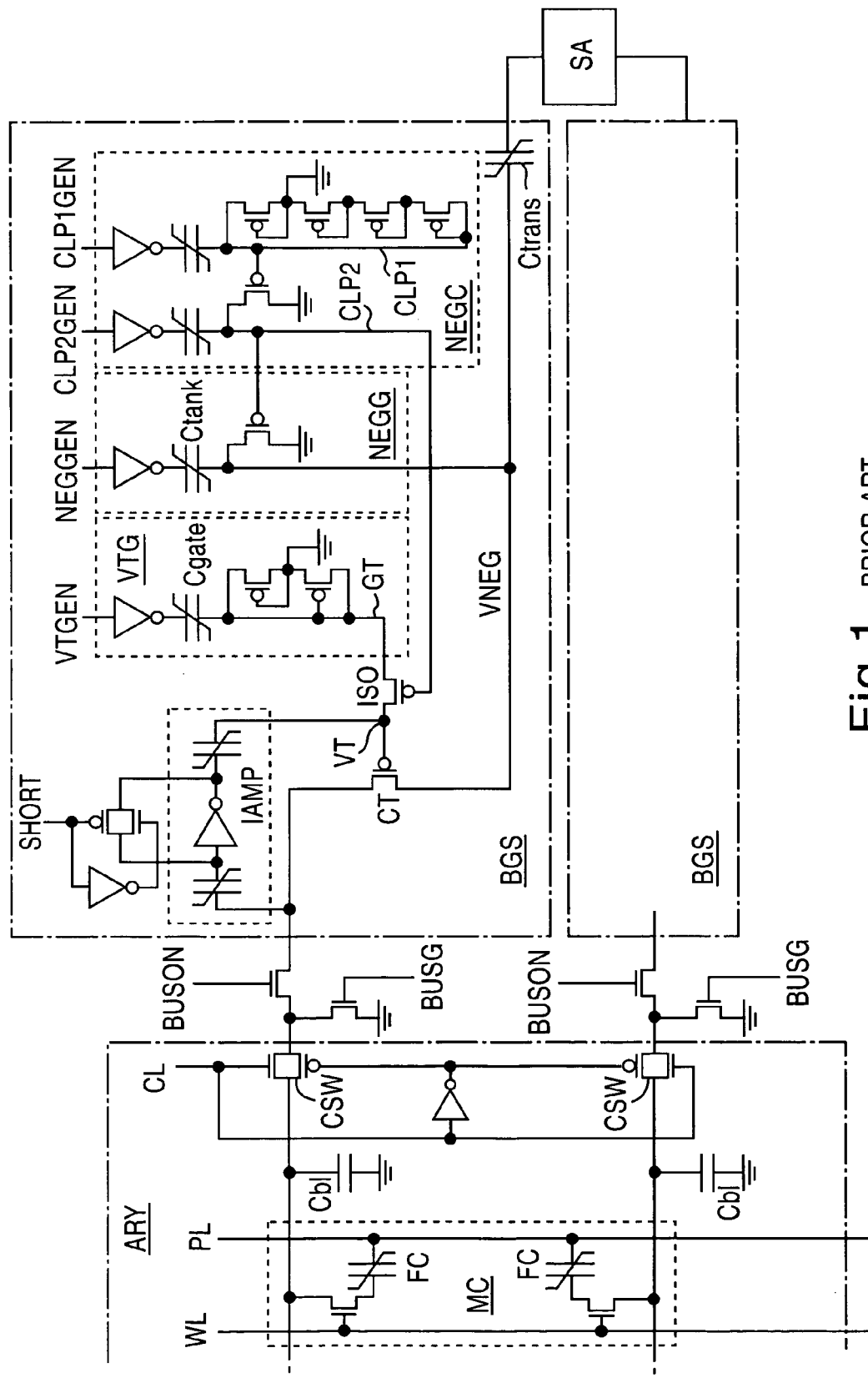
FIG. 1 is a circuit diagram of the main part of a ferroelectric memory that employs a conventional bit line GND sensing method.

Embodiments of the present invention will be hereinafter described with reference to the drawings. Double circles in the drawings represent external terminals. In the drawings, each signal line that is drawn as a thick line actually consists of a plurality of lines. Parts of blocks to which thick lines are connected are each composed of a plurality of circuits. Each signal that is supplied via an external terminal is given a symbol that is the same as its terminal name. Each signal line for transmitting a signal is given a symbol that is the same as the name of the signal.

Figure 2:
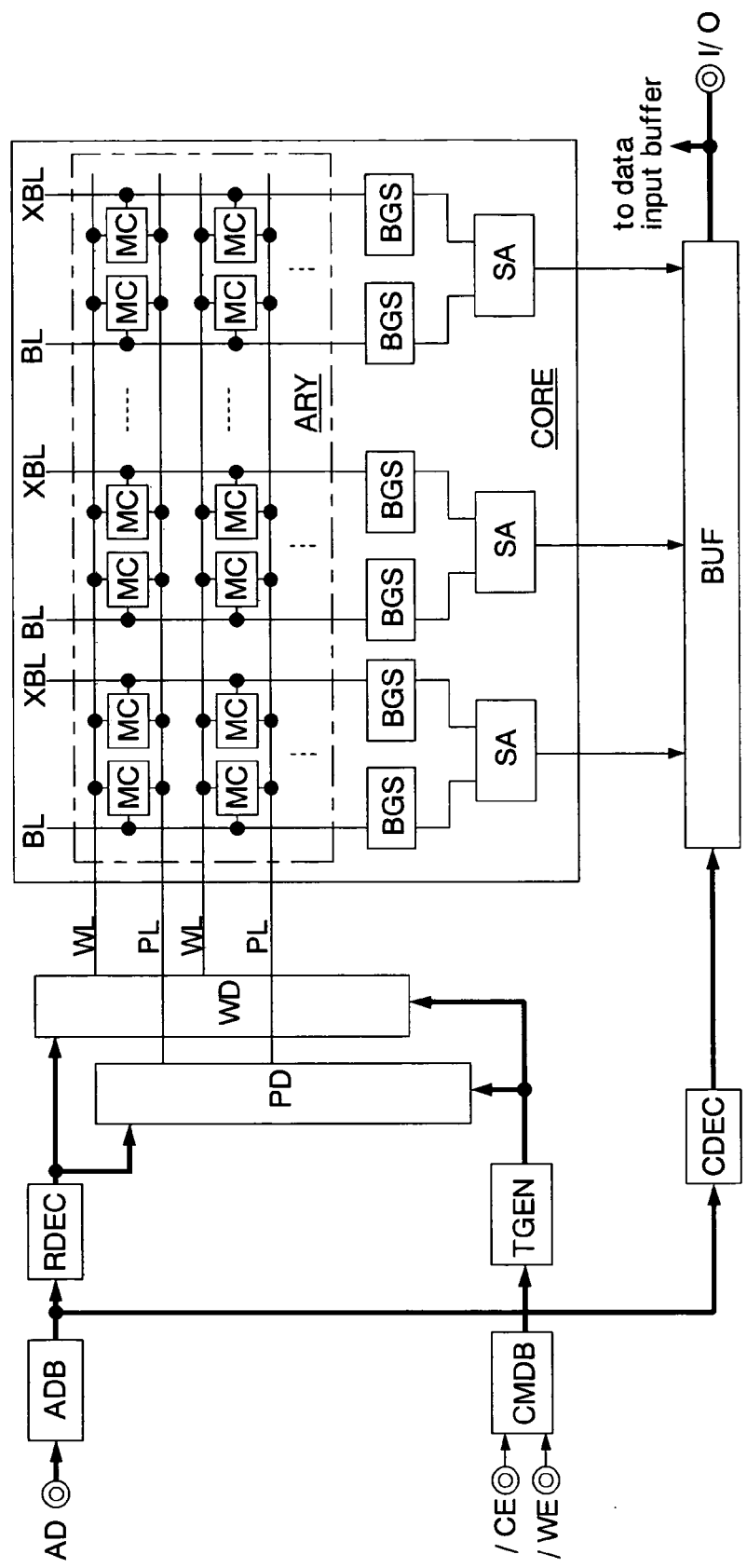
FIG. 2 is a block diagram of a first embodiment of the present invention.

FIG. 2 shows a ferroelectric memory according to a first embodiment of the invention. A ferroelectric memory chip is formed on a silicon substrate by using a CMOS process.

For example, the ferroelectric memory is used as a work memory of a hand-held terminal such as a cellular phone. The ferroelectric memory has an address buffer ADB, a command buffer CMDB, a row decoder RDEC, a timing generator TGEN, a column decoder CDEC, a plate driver PD, a word driver WD, a memory core CORE, and a data output buffer BUF. FIG. 2 mainly shows circuits that are necessary for a read operation. Therefore, circuits necessary for a write operation such as a data input buffer and a write amplifier are omitted.

The address buffer ADB receives an address signal via an address terminal and outputs the received signal to the row decoder RDEC and the column decoder CDEC. The row decoder RDEC generates a row decoded signal by decoding upper bits (row address) of the address signal and outputs the generated signal to the word driver WD. The column decoder CDEC generates a column-decoded signal by decoding lower bits (column address) of the address signal and outputs the generated signal to a column decoder array CDEC.

The command buffer CMDB receives a command signal such as a chip select signal /CS or a write enable signal /WE via a command terminal and outputs the received signal to the timing generator TGEN. The timing generator TGEN decodes an operation mode indicated by the received command signal and outputs timing signals necessary for operation of the plate driver PD, the word driver WD, the data output buffer OBF, etc. in accordance with a decoding result.

The plate driver PD selects a plate line PL in response to the timing signal from the timing generator TGEN and the row decoded signal from the row decoder RDEC. The potential of the selected plate line PL is changed to the high level and kept at that level for a prescribed period.

The word driver WD selects a word line WL in response to the timing signal from the timing generator TGEN and the row decoded signal from the row decoder RDEC. The potential of the selected word line WL is changed from the low level to the high level.

The memory core CORE has a memory cell array ARY, bit-line GND sensing circuits BGS corresponding to respective bit lines BL and XBL, and sense amplifiers SA each of which corresponds to a pair of bit lines BL and XBL.

Figure 3:
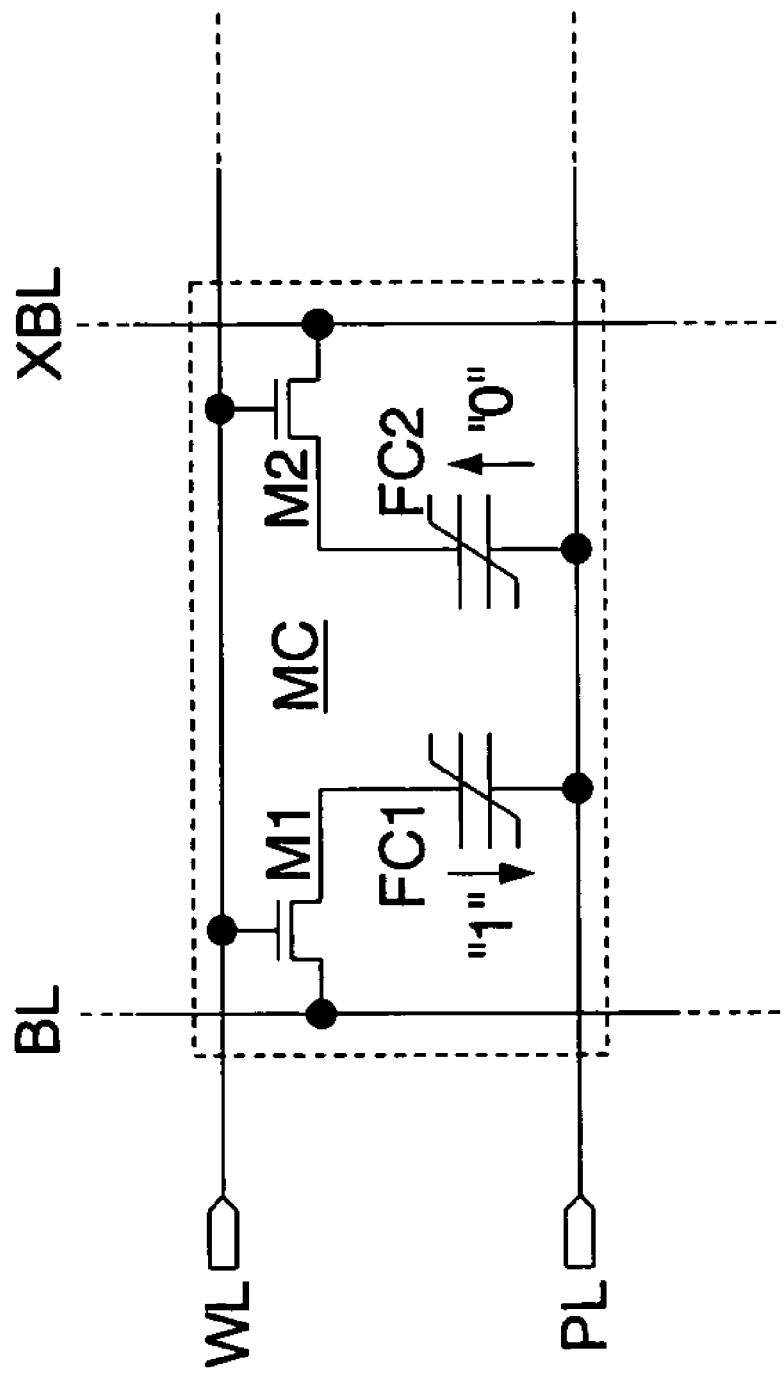
FIG. 3 is a circuit diagram showing the details of each memory cell shown in FIG. 2.

The memory cell array ARY has a plurality of memory cells MC that are arranged in matrix form, and a plurality of word lines WL and a plurality of bit lines BL and XBL that are connected to the memory cells MC. As shown in FIG. 3, each memory cell MC is a 2T2C memory cell (described later).

Each pair of bit-line GND sensing circuits BGS operates in reading data from an associated memory cell MC. Each bit-line GND sensing circuit BGS converts, to a voltage, charge that is read out to the associated bit line BL or XBL and outputs the resulting voltage to the associated sense amplifier SA.

Each sense amplifier SA amplifies a readout voltage that is output from the associated bit-line GND sensing circuits BGS corresponding to the associated pair of bit lines BL and XBL, and outputs the amplified voltage to the data output buffer BUF.

The data output buffer BUF selects, in accordance with the column-decoded signal, 16 bits from readout data that is read from the memory core CORE, and outputs the selected part of the readout data to a data input/output terminal I/O, which has a 16-bit structure.

FIG. 3 shows the details of each memory cell MC.

The memory cell MC has ferroelectric capacitors FC1 and FC2 and transfer transistors M1 and M2 that are nMOS transistors. One end of the ferroelectric capacitor FC1 is connected to the bit line BL via the transfer transistor M1 and the other end is connected to the plate line PL.

One end of the ferroelectric capacitor FC2 is connected to the bit line XBL via the transfer transistor M2 and the other end is connected to the plate line PL. The gates of the transfer transistors M1 and M2 are connected to the word line WL. In FIG. 3, arrows that accompany the respective ferroelectric capacitors FC1 and FC2 indicate their polarization states. The upward arrow represents a state that a logical value "0" is stored and the downward arrow represents a state that a logical value "1" is stored. In this manner, in 2T2C cells, opposite data are written to the two ferroelectric capacitors FC1 and FC2.

Figure 4:
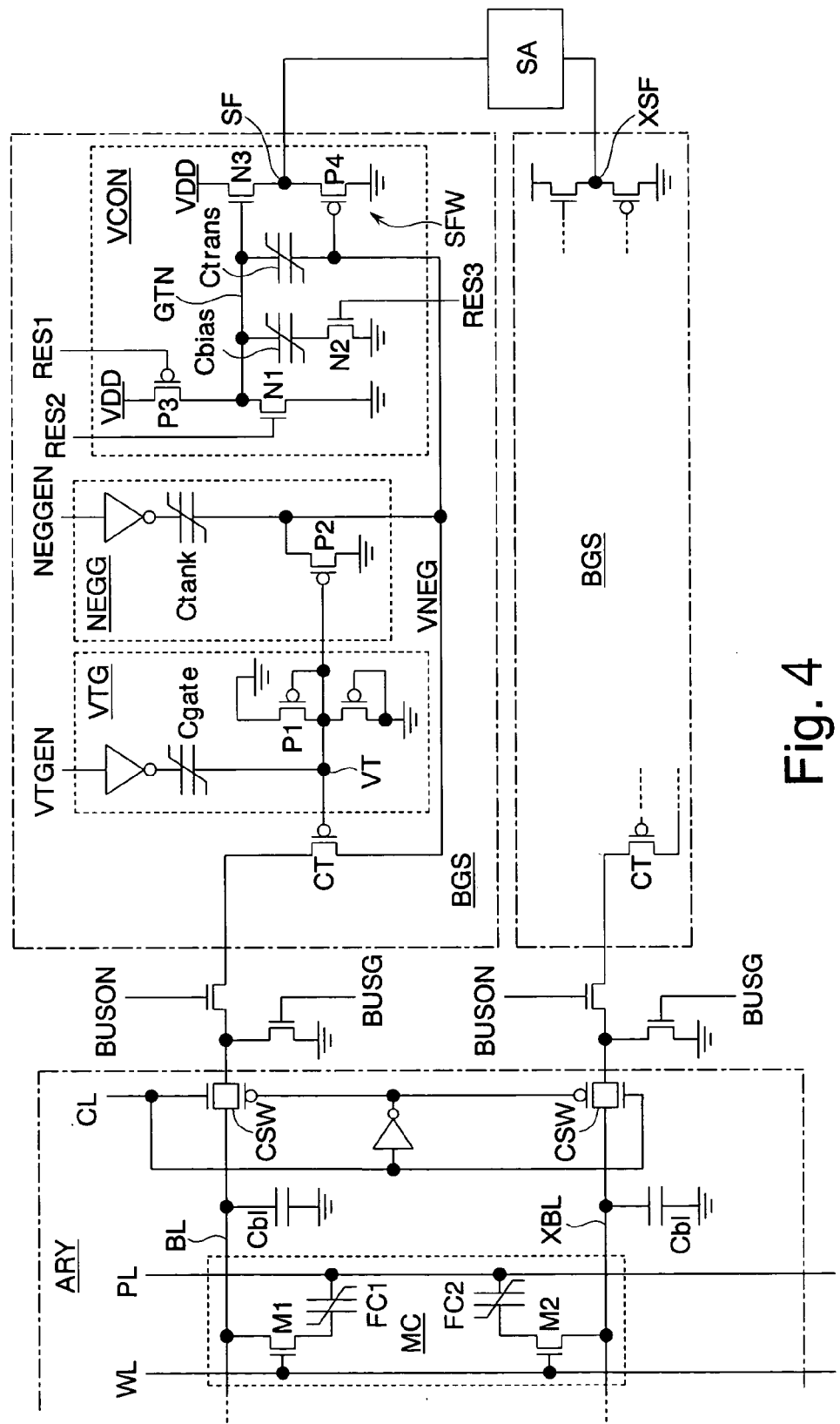
FIG. 4 is a circuit diagram of the main part of FIG. 2.

FIG. 4 shows the details of each bit-line GND sensing circuit BGS. The memory cell array ARY and the transistors connected to the data bus lines are configured in the same manners as shown in FIG. 1 and hence will not be described.

The bit-line GND sensing circuit BGS has a charge-transfer CT that is a pMOS transistor, a threshold voltage generator VTG, a negative voltage generator NEGG, and a voltage conversion circuit VCON.

The threshold voltage generator VTG has the same function as that shown in FIG. 1.

That is, the threshold voltage generator VTG has a capacitor Cgate (second coupling capacitor) and a clamping circuit. However, the threshold voltage of a pMOS transistor P1 (third pMOS transistor) of the clamping circuit is different from that of the corresponding transistor in FIG. 1. The threshold voltage of the pMOS transistor P1 is set lower (deeper) than that of the charge-transfer CT (first pMOS transistor). For example, the threshold voltages of the charge-transfer CT and the pMOS transistor P1 are set at −0.7 V and −0.8 V, respectively. Therefore, when the potential of a node VT (second node) is clamped at a negative voltage by the pMOS transistor P1, the charge-transfer CT is turned on so as to allow a flow of slight current.

The different threshold voltages are set for the charge-transfer CT and the pMOS transistor P1 by making their ratios W/L of the gate width W to the channel length L different from each other. In this example, the ratio W/L of the pMOS transistor P1 is set smaller than that of the charge-transfer CT.

The negative voltage generator NEGG has a capacitor Ctank (first coupling capacitor) that receives the inverted logic of a control signal NEGGEN at one end and a pMOS transistor P2 (second pMOS transistor) for initializing a node VNEG (first node) to the ground potential. The threshold voltage of the pMOS transistor P2 is set lower than that of the pMOS transistor P1. For example, the threshold voltage of the pMOS transistor P2 is set at −0.9 V. Therefore, when the potential of the node VT (second node) is clamped at −0.8 V by the pMOS transistor P1, the pMOS transistor P2 is turned off. More specifically, as described later, the pMOS transistor P2 is turned on only when the potential of the node VT becomes lower than −0.9 V temporarily in response to a variation of a control signal VTGEN to a high level.

The different threshold voltages are set for the pMOS transistors P1 and P2 by making their ratios W/L of the gate width W to the channel length L different from each other. In this example, the ratio W/L of the pMOS transistor P2 is set smaller than that of the pMOS transistor P1.

The voltage conversion circuit VCON has a pMOS transistor P3 and an nMOS transistor N1 that are provided between a power supply line VDD and a ground line and connected to each other in series via a node GTN (third node), a capacitor Cbias (dividing capacitor) and an nMOS transistor N2 that are provided between the node GTN and the ground line and connected to each other in series, a capacitor Ctrans (third coupling capacitor) that is provided between the node GTN and the node VNEG, and a source follower circuit SFW. The source follower circuit SFW has an nMOS transistor N3 and a pMOS transistor P4 that are provided between the power supply line VDD and the ground line and connected to each other in series via an output node SF or XSF of the sense amplifier SA. The gates of the pMOS transistor P3 and the nMOS transistors N1 and N2 receive reset signals RES1, RES2, and RES3, respectively.

The gate voltage (i.e., the potential of the node GTN) of the source follower circuit SFW (i.e., nMOS transistor N3) is initialized so as to become higher than the threshold voltage of the nMOS transistor N3 and lower than (power supply voltage VDD)−(threshold voltage Vth) in response to a voltage variation at the node VNEG that occurs in a sensing operation of the bit-line GND sensing circuit BGS.

Figure 5:
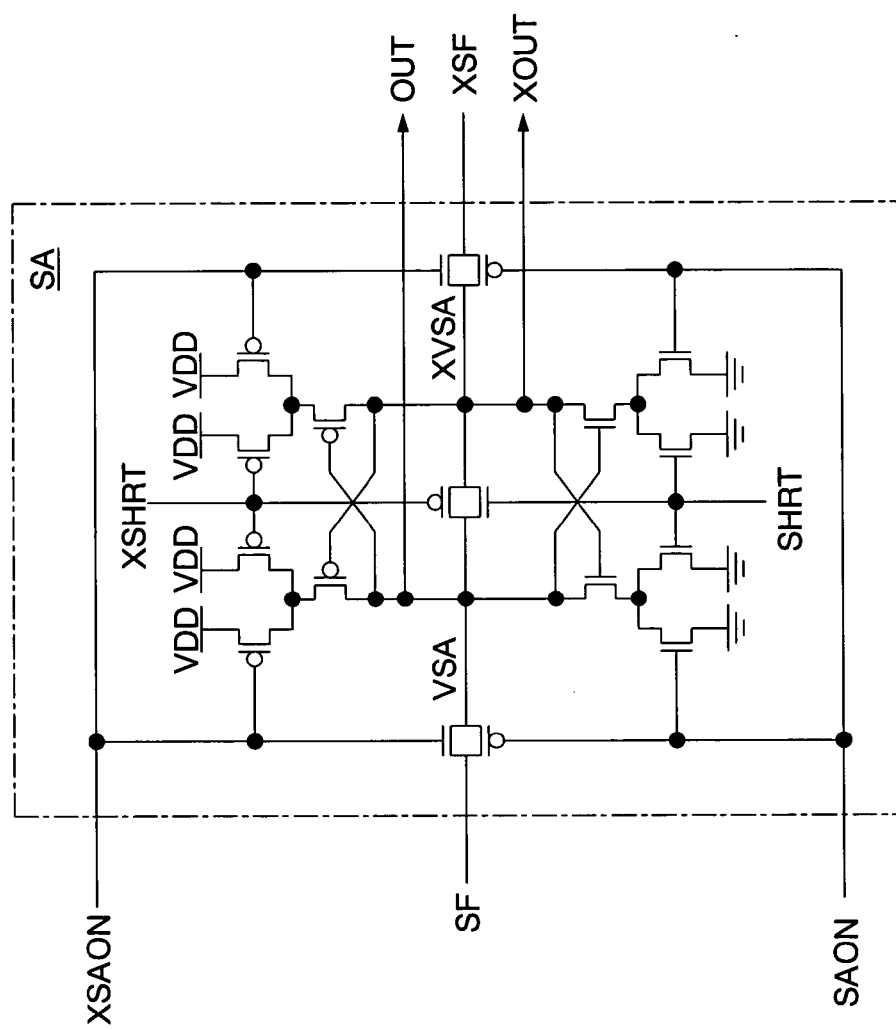
FIG. 5 is a circuit diagram showing the details of each sense amplifier shown in FIG. 2.

FIG. 5 shows the details of each sense amplifier SA shown in FIG. 2, which is a known circuit.

The sense amplifier SA has a pair of CMOS inverters whose inputs and outputs are connected to each other, a plurality of pMOS and nMOS transistors that connect the power supply terminals and ground terminals of the CMOS inverters to the power supply line VDD and the ground line, respectively, a CMOS transmission gate that connects input nodes VSA and XVSA of the CMOS inverters to each other, a CMOS transmission gate that connects the node SF to the node VSA, and a CMOS transmission gate that connects the node XSF to the node XVSA.

After equalizing the nodes VSA and XVSA in response to short signals SHRT and XSHRT, the sense amplifier SA receives readout data from the bit-line GND sensing circuits BGS shown in FIG. 4 via the nodes SF and XSF. At this time, the nodes SF and VSA are electrically continuous with each other and the nodes XSF and XVSA are also electrically continuous with each other. Then, sense amplifier activation signals SAON and XSAON are made active for a prescribed time, whereby the readout data are amplified differentially. Resulting data is output to output terminals OUT and XOUT and transferred to the data output buffer BUF shown in FIG. 2.

Figure 6:
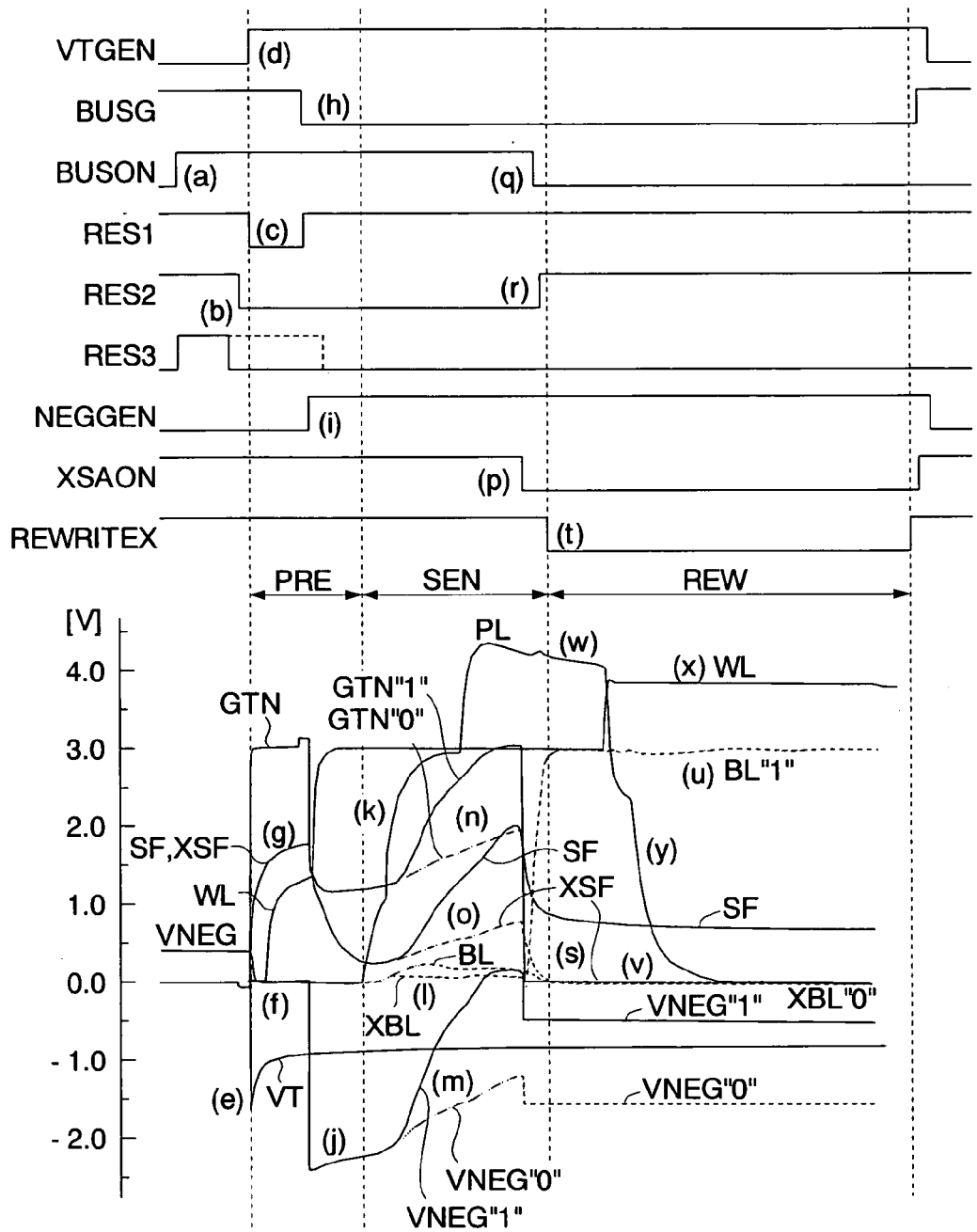
FIG. 6 is a timing chart showing a read operation of the first embodiment.

FIG. 6 shows a read operation of the first embodiment. Waveforms shown in the top part of FIG. 6 are input signals and waveforms shown in the bottom part of FIG. 6 are simulation results.

In this example, a logical value "1" is stored in a ferroelectric capacitor FC that is connected to the bit line BL and a logical value "0" is stored in a ferroelectric capacitor FC that is connected to the bit line XBL. The effective capacitance of the ferroelectric capacitor FC in which the logical value "0" is stored is small because of no reverse polarization. In contrast, the effective capacitance of the ferroelectric capacitor FC in which the logical value "1" is stored is large because of occurrence of reverse polarization. In the simulation waveforms, the nodes GTN and VNEG whose symbols are given "1" are nodes corresponding to the bit line BL to which the logical value "1" is to be read out. The nodes GTN and VNEG whose symbols are given "0" are nodes corresponding to the bit line XBL to which the logical value "0" is to be read out.

The read operation includes a precharging period PRE in which to initialize prescribed circuits before reading data from the memory cell MC, a sense period SEN in which to read data from the memory cell MC by causing the bit-line GND sensing circuits and the sense amplifiers SA, and a rewrite period REW in which to rewrite amplified data to the memory cell MC.

First, in the precharging period PRE, the bus-on signal BUSON varies to the high level, whereby the bit lines BL and XBL are connected to the bit-line GND sensing circuits BGS via the column switches CSW (FIG. 6(a)). A high-level pulse rises in the reset signal RES3 and the reset signal RES2 varies to the low level, whereby both ends of the capacitor Cbias of the voltage conversion circuit VCON shown in FIG. 4 are grounded (FIG. 6(b)). The reset signal RES3 varies to the low level, whereby the capacitance of the capacitor Cbias that is connected to the node GTN is made ineffective. Then, a low-level pulse rises in the reset signal RES1, whereby the node GTN is connected to the power supply line VDD (FIG. 6(c)).

When the control signal VTGEN varies to the high level (FIG. 6(d)), charge is extracted from the node VT. The potential of the node VT of the threshold voltage generator VTG temporarily lowers to about −1.7 V (deep negative voltage) (FIG. 6(e)). Then, the potential of the node VT is increased by a clamping operation of the pMOS transistor P1 of the clamping circuit and thereafter kept at about −0.8 V (constant voltage).

During a period (undershoot period) when the potential of the node VT is lower than −0.9 V, the pMOS transistor P2 of the negative voltage generator NEGG is kept on and the node VNEG is initialized to the ground potential (FIG. 6(f)). In this manner, the initialization of the node VT to −0.8 V and the initialization of the VNEG to the ground potential are caused by the single control signal VTGEN. As a result, the precharging period PRE can be made shorter than in the conventional case. Further, since the negative voltage control circuit NEGC shown in FIG. 1 is not necessary, the circuit scale of each bit-line GND sensing circuit BGS can be reduced.

Subsequently, the potential of the word line WL varies to a high level (FIG. 6(g)), whereby the ferroelectric capacitors FC are connected to the respective bit lines BL and XBL.

The column-selecting signal CL varies to the high level (not shown in FIG. 6), whereby the bit lines BL and XBL are connected to the respective data bus lines. Then, the bus-grounding signal BUSG varies to the low level (FIG. 6(h)), whereby the precharging on the bit lines BL and XBL and the data bus lines is canceled.

Then, the control signal NEGGEN varies to the high level (FIG. 6(i)), whereby charge is extracted from the node VNEG. The node VNEG is initialized to a negative voltage (about 2.5 V) (FIG. 6(j)). Following the voltage variation of the node VNEG because of the action of the coupling capacitor Ctrans, the potential of the node GTN varies to a prescribed positive voltage.

The capacitor Cbias is charged to the power supply voltage VDD by elongating the high-level period of the reset signal RES3 until after the fall of the low-level pulse of the reset signal RES1 (indicated by a broken line in FIG. 6). Therefore, the initial voltage of the node VTG can be set in accordance with the capacitance ratio between the capacitors Cbias and Ctrans without causing a flow of a DC current.

The precharging period PRE is shortened by initializing the node VNEG to the ground potential utilizing the undershoot period of the node VT. The read access time is shorted accordingly. Initializing the node VNEG to the ground potential utilizing the charge extraction from the node VT by the capacitor Cgate makes it possible to reduce the scale of circuits that are necessary for the initialization. As a result, the chip size of the ferroelectric memory is made smaller.

Subsequently, in the sense period SEN, first, the potential of the plate line PL varies to a high level (FIG. 6(k)). Currents corresponding to residual dielectric polarization values of the ferroelectric capacitors FC flow into the bit lines BL and XBL, respectively, whereby the potentials of the bit lines BL and XBL increase slightly (FIG. 6(l)). The potential of the bit line BL that is connected to the ferroelectric capacitor FC having a larger effective capacitance becomes higher than that of the bit line XBL that is connected to the ferroelectric capacitor FC having a smaller effective capacitance.

In this state, a voltage (−0.8 V) that is slightly lower than the threshold voltage (−0.7 V) of the charge-transfer CT is applied to the gate (node VT) of the charge-transfer CT. Therefore, the charge-transfer CT is turned on so as to allow a flow of slight current, whereby the current that has flown into each bit line BL or XBL leaks to the node VNEG. As a result, the potential of the node VNEG increases in accordance with the residual dielectric polarization value of the ferroelectric capacitor FC (FIG. 6(m)).

In this embodiment, a feedback circuit such as an inverter amplifier for controlling the potential of the bit line BL or XBL to 0 V is not necessary, as a result of which no isolatiori gate for isolating the node VT and the capacitor Cgate from each other is necessary. Further, no circuit for generating a deep negative voltage for turning on the isolation gate is necessary. As a result, the circuit scale is reduced and the chip size of the ferroelectric memory is decreased. By virtue of the reduction in circuit scale, the power consumption of the ferroelectric memory is reduced. In particular, the removal of the inverter amplifiers greatly contributes to the reduction of the power consumption. Since no complicated initial setting needs to be performed in the precharging period PRE, the precharging period PRE and the read access time are further shortened.

Because of the presence of the coupling capacitor Ctrans of the voltage conversion circuit VCON, the potential of the node GTN varies following the voltage variation of the node VNEG (FIG. 6(n)). In other words, the negative voltage of the node VNEG is converted to a positive voltage of the node GTN by the coupling capacitor Ctrans. The source follower circuit SFW operates with the voltage variation of the node GTN, whereby the potentials of the nodes SF and XSF increase (FIG. 6(o)).

During the sensing operation of the bit-line GND sensing circuit BGS, the gate voltage of the source follower circuit SFW (i.e., nMOS transistor N3) is made higher than the threshold voltage Vth of the nMOS transistor N3 and lower than (power supply voltage VDD)-(threshold voltage Vth) by the initialization of the potential of the node GTN. Therefore, the source follower circuit SFW can operate so as to respond to any variation in the entire voltage variation range of the node VNEG. As a result, the gain of the source follower circuits SFW is increased to 90% in contrast to a conventional value of 60%. The gain of the source follower circuits SFW is the ratio of the output voltage (SF−XSF) to the input voltage (VNEG"1"−VNEG"0").

Subsequently, the sense amplifier activation signal XSAON turns active (FIG. 6(p)), whereby the voltage difference between the input nodes SF and XSF is amplified (differential amplification). The data that has been read from the memory cell MC and amplified is read out to the outside via the data input/output terminal. It is noted that in the simulation of FIG. 6 the nodes SF and XSF are not connected to the sense amplifiers SA and hence the voltages at the nodes SF and XSF are not amplified.

The bus-on signal BUSON varies to the low level (FIG. 6(q)), whereby the bit lines BL and XBL are disconnected from the bit-line GND sensing circuits BGS. The reset signal RES2 varies to the high level (FIG. 6(r)), whereby the potential of the node GTN varies to the ground potential. The source follower circuits SFW each respond to the voltage variation of the node GTN and thereby lower the potentials of the nodes SF and XFS (FIG. 6(s)).

Next, in the rewrite period REW, the rewrite signal REWRITEX turns active (FIG. 6(t)) to start a rewrite operation. As a result of the rewrite operation, the voltages as amplified by the sense amplifiers SA are transmitted to the bit lines BL and XBL. The potential of the bit line BL increases to the power supply voltage VDD (FIG. 6(u)) while the potential of the bit line XBL decreases to the ground potential (FIG. 6(v)). To apply a high voltage to the ferroelectric capacitors FC to be accessed, a boosted voltage that is higher than the power supply voltage VDD is applied to the plate line PL (FIG. 6(w)). A logical value "0" is rewritten during a period when the potential of the plate line PL is set at the boosted voltage.

Then, the potential of the word line WL is set at a boosted voltage that is higher than the power supply voltage VDD (FIG. 6(x)) and the potential of the plate line PL is set at the ground potential (FIG. 6(y)). Setting the potential of the word line WL at the boosted voltage allows the high-level voltage of the bit line BL to be transmitted to the ferroelectric capacitor FC reliably. A logical value "1" is thereby rewritten.

As described above, according to this embodiment, a feedback circuit such as an inverter amplifier can be made unnecessary by setting the gate voltage of the charge-transfer CT slightly lower than its threshold voltage. As a result, the chip size of the ferroelectric memory can be decreased and its power consumption can be reduced.

The node VNEG can be initialized to the ground potential by turning on the pMOS transistor utilizing the undershoot period when the potential of the node VT varies from a deep negative voltage to a constant negative voltage. Therefore, the node VNEG can be initialized quickly and the precharging period PRE can be shortened. As a result, the read access time can be shortened. Further, the circuits that are necessary for the precharging can be simplified in configuration. This contributes to decreasing the chip size of the ferroelectric memory.

The clamping circuit is formed by using the pMOS transistor P1 having a lower threshold voltage than the charge-transfer CT. Therefore, the clamping circuit can easily generate a constant negative voltage that is lower than the threshold voltage of the charge-transfer CT.

The threshold voltage of the pMOS transistor P2 is lower than that of the pMOS transistor P1. This makes it possible to prevent a phenomenon that charge is supplied from the ground line to the node VNEG via the pMOS transistor P2 after the potential of the node VT has varied from the deep negative voltage to the constant negative voltage that corresponds to the threshold voltage of the pMOS transistor P1. This in turn makes it possible to set the potential of the node VNEG at a prescribed negative voltage reliably.

The threshold voltages of the charge-transfer CT and the p-MOS transistors P1 and P2 can be set simply with high accuracy by making their ratios W/L of the gate width W to the channel length L different from each other.

The potential of the node GTN is set at a prescribed positive voltage in advance by the capacitors Cbias and Ctrans. This facilitates the conversion of a negative voltage of the node VNEG that goes up following a current that flows from the memory cell MC into the bit line BL or XBL to a positive voltage that allows the source follower circuit SFW to operate normally. This makes it possible to increase the gain of the source follower circuits SFW.

Charging the capacitor Cbias to a prescribed voltage in advance makes it possible to set the potential of the node GNT at a desired initial voltage by the capacitance-type voltage division using the capacitors Cbias and Ctrans.

Figure 7:
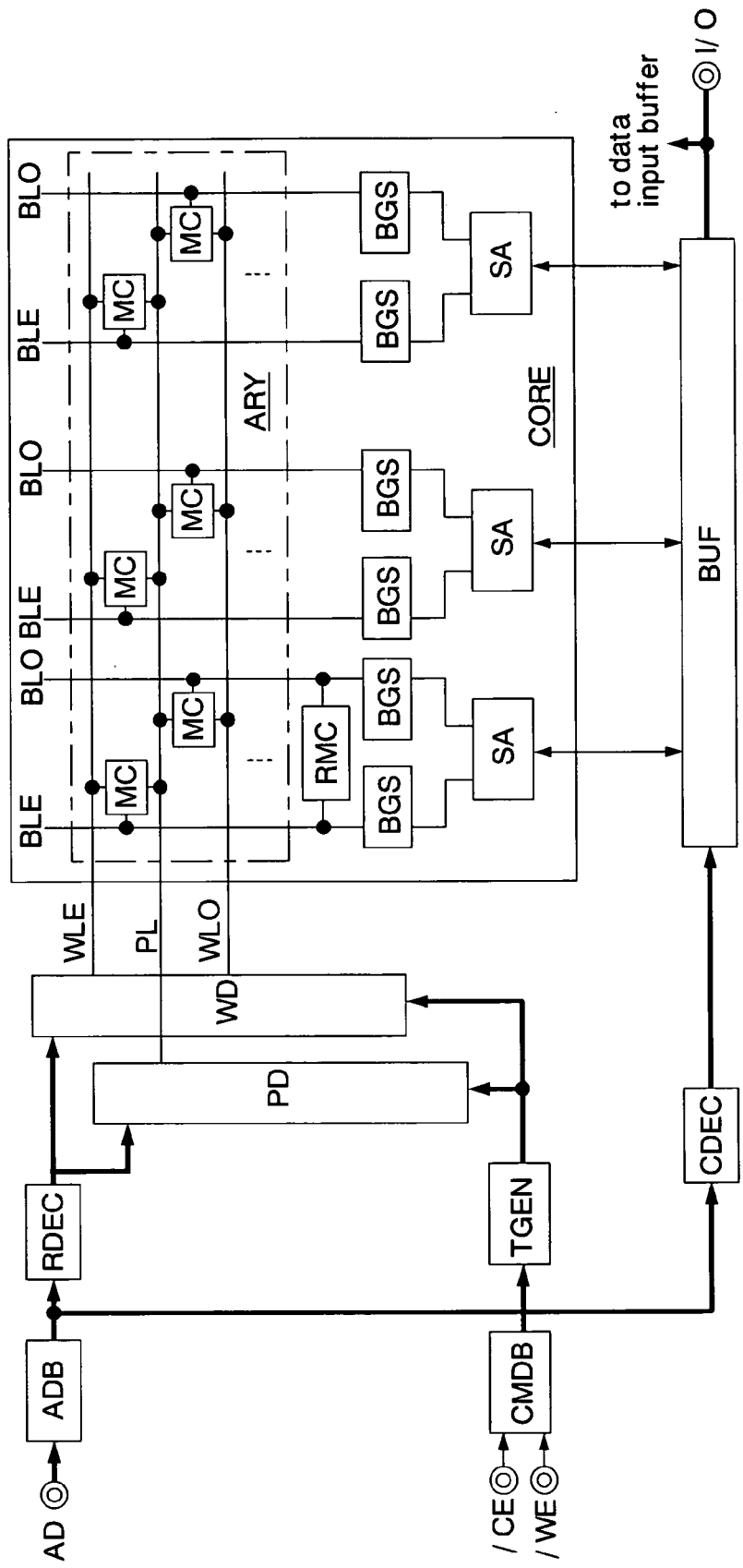
FIG. 7 is a block diagram of a second embodiment of the invention.

FIG. 7 is a block diagram of a second embodiment of the invention. Circuits and signals that are the same as described in the first embodiment are given the same reference symbols as the latter and will not be described in detail.

A memory cell array ARY of this embodiment is different from the memory cell array ARY of the first embodiment shown in FIG. 2. The memory cell array ARY of this embodiment employs 1T1C memory cells MC. Each memory cell that is connected to a word line WLE is connected to a bit line BLE. Each memory cell that is connected to a word line WLO is connected to a bit line BLO. The memory cell array ARY has a reference memory cell RMC for each pair of bit lines BLE and BLO. The second embodiment is approximately the same as the first embodiment in the other part of the configuration.

Figure 8:
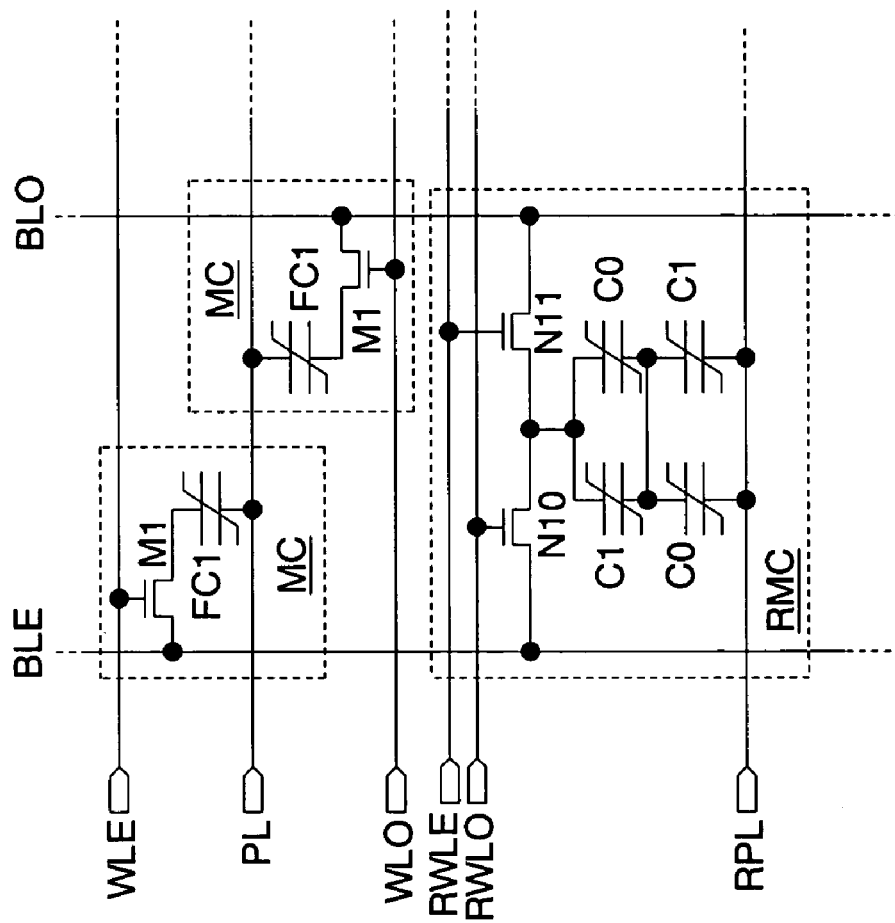
FIG. 8 is a circuit diagram showing the details of each memory cell shown in FIG. 2.

FIG. 8 shows the details of the memory cell array ARY shown in FIG. 7.

Each memory cell MC has a ferroelectric capacitor FC1 and a transfer transistor M1 that is an nMOS transistor. One end of the ferroelectric capacitor FC1 is connected to the bit line BLE or BLO via the transfer transistor M1 and the other end is connected to a plate line PL. The gates of the transfer transistors M1 of the associated memory cells MC are connected to the different word lines WLE and WLO. That is, the memory cells MC that are connected to the complementary bit lines BLE and BLO are not accessed simultaneously.

The reference memory cell RMC has two nMOS transistors N10 and N11 and a reference capacitor that consists of four ferroelectric capacitors C0 and C1 that are the same as the ferroelectric capacitor FC1 of each memory cell MC. The nMOS transistor N10 connects the reference capacitor to the bit line BLE when the potential of a reference word line RWLO is at a high level. The nMOS transistor N11 connects the reference capacitor to the bit line BLO when the potential of a reference word line RWLE is at a high level.

The reference capacitor is configured in such a manner that two capacitance pairs each of which is a series connection of ferroelectric capacitors C0 and C1 for storing logical values "0" and "1," respectively, are connected to each other in parallel. One end of each capacitance pair is connected to a reference plate line RPL. The capacitance of the reference capacitor is equal to (C0+C1)/2, which is the middle value between the capacitance of the ferroelectric capacitor FC1 for storing a logical value "0" and the capacitance of the ferroelectric capacitor FC1 for storing a logical value "1." The middle capacitance value can be obtained easily with high accuracy by forming a reference capacitor as a combination of a plurality of ferroelectric capacitors that are the same as the memory cell capacitor.

In the memory cell array ARY consisting of the 1T1C cells, when the potential of the word line WLE varies to the high level and a memory cell MC that is connected to the bit line BLE is selected, the potential of the reference word line RWLE is changed to the high level to connect the reference capacitor to the bit line BLO. Similarly, when the potential of the word line WLO varies to the high level and a memory cell MC that is connected to the bit line BLO is selected, the potential of the reference word line RWLO is changed to the high level to connect the reference capacitor to the bit line BLE. The potential of the bit line BLE (or BLO) that depends on the capacitance of the ferroelectric capacitor FC1 and the potential of the bit line BLO (or BLE) that depends on the capacitance of the reference capacitor are transmitted to the respective bit-line GND sensing circuits.

Figure 9:
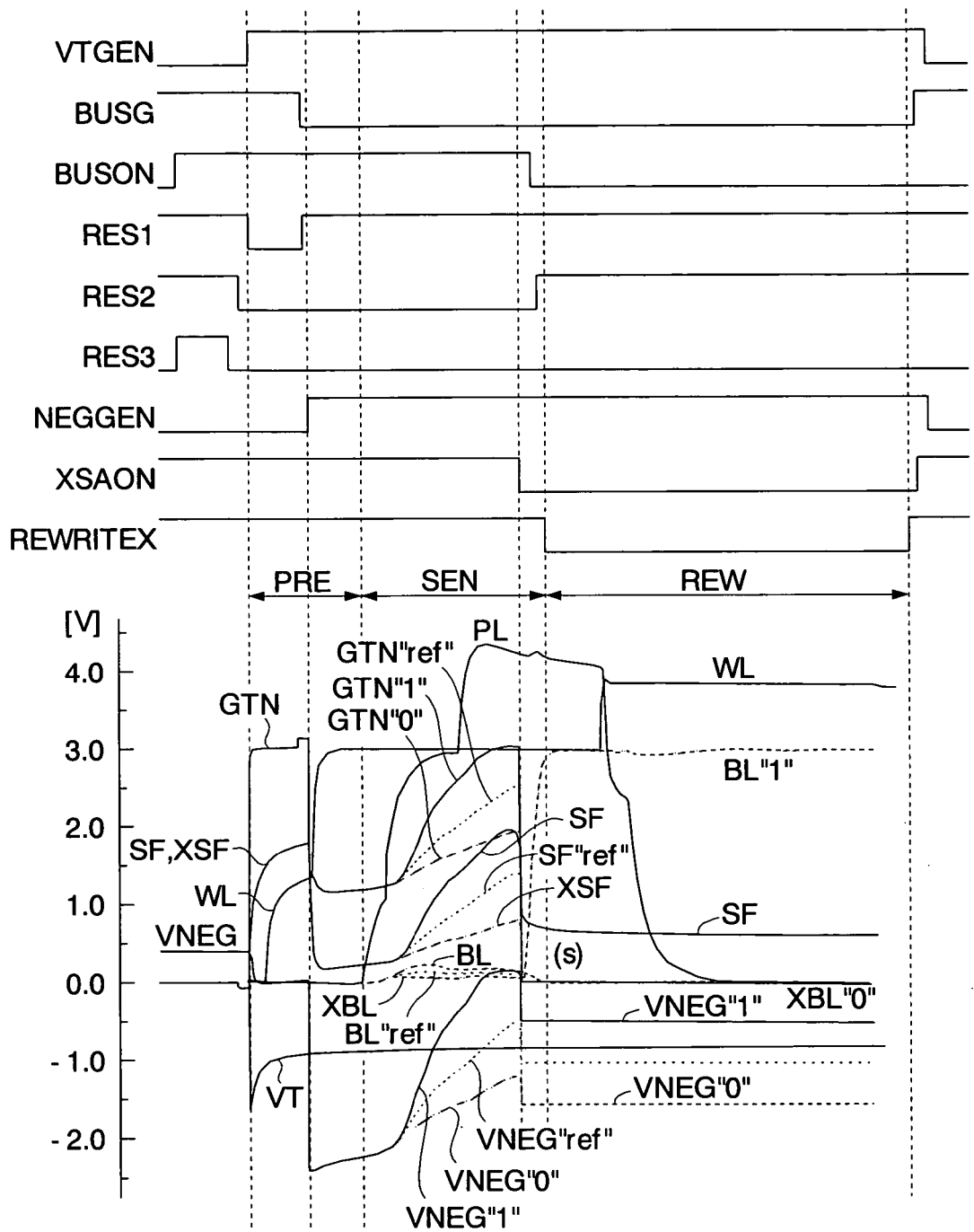
FIG. 9 is a timing chart showing a read operation of the second embodiment.

FIG. 9 shows a read operation of the second embodiment. Waveforms shown in the top part of FIG. 9 are input signals and waveforms shown in the bottom part of FIG. 9 are simulation results.

The timing relationships between the input signals are the same as in the first embodiment. As for the simulation waveforms, the voltages of the nodes SF and XSF are slightly different than in the first embodiment, which results from the difference in the cell structure (1T1C or 2T2C). Symbols with "ref" at the tail denote waveforms of nodes corresponding to the reference memory cell RMC. The voltage of a node that is denoted by a symbol with "ref" is equal to the middle value between the voltages of the associated nodes that are denoted by symbols with "1" and "0," respectively. As is apparent from FIG. 9, the simulation waveforms are basically the same as in the first embodiment.

This embodiment can provide the same advantages as the first embodiment does.

Although the above embodiments are such that the invention is applied to the ferroelectric memory chips, the invention is not limited to those embodiments, and various modifications may be made without departing from the spirit and scope of the invention. For example, the invention may be applied to a ferroelectric memory core that is incorporated in a system LSI. Any improvement may be made in part or all of the components.

What is claimed is:

1. A ferroelectric memory comprising:
    a memory cell having a ferroelectric capacitor;
    a bit line connected to said memory cell;
    a first pMOS transistor whose source, drain, and gate are connected to a first node, said bit line, and a second node, respectively;
    a negative voltage generator initially setting a potential of said first node at a prescribed negative voltage; and
    a threshold voltage generator generating, at said second node, a constant voltage that is slightly lower than a threshold voltage of said first pMOS transistor.

2. The ferroelectric memory according to claim 1, wherein:
    said negative voltage generator comprises a first coupling capacitor that is connected to said first node and a second pMOS transistor whose source, drain, and gate are connected to said first node, a ground line, and said second node; and
    said threshold voltage generator comprises a second coupling capacitor that is connected to said second node and a clamping circuit connected to said second node, the clamping circuit clamping a potential of said second node at said constant voltage when charge is extracted from said second node by said second coupling capacitor.

3. The ferroelectric memory according to claim 2, wherein:
    said clamping circuit comprises a third pMOS transistor whose source, drain, and gate are connected to said second node, said ground line, and said second node, respectively; and
    a threshold voltage of said third pMOS transistor is lower than said threshold voltage of said first pMOS transistor.

4. The ferroelectric memory according to claim 3, wherein said threshold voltages of said first and third pMOS transistors are set at different voltages by making their ratios W/L of a gate width W to a channel length L different from each other.

5. The ferroelectric memory according to claim 3, wherein a threshold voltage of said second pMOS transistor is lower than said threshold voltage of said third pMOS transistor.

6. The ferroelectric memory according to claim 5, wherein said threshold voltages of said second and third pMOS transistors are set at different voltages by making their ratios W/L of a gate width W to a channel length L different from each other.

7. The ferroelectric memory according to claim 2, further comprising:
    a third coupling capacitor provided between said first node and a third node, generating a positive voltage at said third node in accordance with a negative voltage of said first node;
    a source follower circuit having an input terminal that is connected to said third node; and
    a dividing capacitor that is connected to said third coupling capacitor via said third node to set a potential of said third node at a prescribed positive voltage in advance.

8. A data reading method for a ferroelectric memory, comprising the steps of:
    setting a gate voltage of a first pMOS transistor for connecting a bit line connected to a memory cell having a ferroelectric capacitor to a first node whose potential is set at a prescribed negative voltage in advance, at a constant voltage that is slightly lower than a threshold voltage of said first pMOS transistor;
    leaking, to said first node, a current that flows into said bit line from said memory cell in accordance with a residual dielectric polarization value of said ferroelectric capacitor; and
    judging a logical value of data stored in said memory cell on the basis of a voltage increase at said first node.

9. The data reading method for a ferroelectric memory according to claim 8, further comprising the steps, executed before reading said data from said memory cell, of:
    extracting charge from a second node that is connected to a gate of said first pMOS transistor by a second coupling capacitor to temporarily set a potential of said second node at a deep negative voltage;
    supplying charge to said second node by a clamping circuit for setting said potential of said second node at said constant voltage, in a period when said potential of said second node is set at said deep negative voltage;
    initializing said first node to a ground potential by turning on a second pMOS transistor whose source, drain, and gate are connected to said first node, a ground line, and said second node, respectively, in an undershoot period when said potential of said second node varies from said deep negative voltage to said constant voltage; and
    extracting charge from said first node by a first coupling capacitor to set said potential of said first node at said prescribed negative voltage.

* * * * *